United States Patent
Krause

(10) Patent No.: US 6,710,887 B2
(45) Date of Patent: Mar. 23, 2004

(54) TESTING DEVICE AND METHOD FOR ESTABLISHING THE POSITION OF A NOTCH OR BUMP ON A DISK

(75) Inventor: Thomas Krause, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/388,026

(22) Filed: Mar. 13, 2003

(65) Prior Publication Data

US 2003/0160971 A1 Aug. 28, 2003

Related U.S. Application Data

(63) Continuation of application No. PCT/DE01/03185, filed on Aug. 21, 2001.

(30) Foreign Application Priority Data

Sep. 13, 2000 (DE) .......................................... 100 45 203

(51) Int. Cl.[7] .............................................. G01B 11/14
(52) U.S. Cl. ................... 356/614; 250/559.36; 414/936
(58) Field of Search ................................. 356/614, 622, 356/623; 250/559.29, 559.31, 559.33, 559.36, 559.4; 340/674; 414/936, 783

(56) References Cited

U.S. PATENT DOCUMENTS

| | | | |
|---|---|---|---|
| 4,786,816 A | * 11/1988 | Ohmori et al. | ........ 250/559.12 |
| 5,308,993 A | 5/1994 | Holman et al. | |
| 5,319,216 A | * 6/1994 | Mokuo et al. | ........... 250/559.4 |
| 5,418,382 A | * 5/1995 | Blackwood et al. | ... 250/559.36 |
| 5,452,078 A | 9/1995 | Cheng | |
| 5,504,345 A | 4/1996 | Bartunek et al. | |
| 5,851,102 A | * 12/1998 | Okawa et al. | .............. 414/783 |
| 6,147,356 A | * 11/2000 | Hahn et al. | ............ 250/559.29 |
| 6,342,705 B1 | * 1/2002 | Li et al. | ................... 250/559.4 |
| 6,346,987 B1 | * 2/2002 | Smith et al. | ................. 356/614 |
| 6,392,247 B1 | * 5/2002 | Cerny et al. | ............. 250/559.4 |
| 6,423,978 B1 | * 7/2002 | Furuta et al. | .......... 250/559.36 |

FOREIGN PATENT DOCUMENTS

| | | |
|---|---|---|
| DE | 197 28 478 A1 | 2/1999 |
| DE | 198 14 046 C1 | 11/1999 |
| JP | 07218228 A | 8/1995 |

* cited by examiner

Primary Examiner—Hoa Q. Pham
(74) Attorney, Agent, or Firm—Laurence A. Greenberg; Werner H. Stemer; Gregory L. Mayback

(57) ABSTRACT

A testing device is used to establish the position of a notch or bump on a disk. The testing device has: a testing area for positioning at least one disk having an edge with a notch or bump; a light source for illuminating the edge of the disk; a first light sensor for receiving light of the light source reflected by the edge of the disk; a second light sensor for receiving light of the light source reflected by the notch or bump of the disk, if the notch or bump is located within a predetermined positional area; and an assessment unit for establishing, based on the light falling onto the first light sensor, whether a disk is positioned in the testing area and for establishing based on the light falling onto the second light sensor whether the notch or bump is located within the predetermined position.

15 Claims, 2 Drawing Sheets

TESTING DEVICE AND METHOD FOR ESTABLISHING THE POSITION OF A NOTCH OR BUMP ON A DISK

CROSS-REFERENCE TO RELATED APPLICATION

This application is a continuation of copending International Application No. PCT/DE01/03185, filed Aug. 21, 2001, which designated the United States and was not published in English.

BACKGROUND OF THE INVENTION

Field of the Invention

The present invention relates to a testing device for establishing the position of a notch or a bump on a disk, such as a wafer, for example, and a method for establishing this position on the disk.

In the production of integrated circuits, for reducing the throughput times and for lowering the number of rejected wafers, it is desirable to present the wafers to the operators using the transporting system in such a way that the wafers are aligned in a specific manner on the wafer lifts. For this purpose, a notch is cut into the wafer at a specific point. However, it is also conceivable to provide a projecting bump. Notches or bumps are always located in a predetermined position, which is identical for all wafers, in relation to the integrated circuits. The alignment usually takes place in this case by insuring that the notches or bumps are at 12 o'clock, or in other words, at the top, when the wafers are viewed laterally in a wafer mount. The presentation of such aligned wafers dispenses with the need for the operation of carrying out an alignment on what is known as the notch finder, which leads to a saving in terms of distance covered and time, and also makes it possible for the operators to carry out batch number checks immediately, so that the risk of batches being mixed up is reduced.

The alignment of the wafers takes place on a notch finder. This is a device that is capable of turning the wafer until the notch or the bump is located in the predetermined position. However, it was previously not possible to carry out automatic checking of the correct alignment of a notch or bump during the transporting of the wafers, let alone to correct this alignment.

SUMMARY OF THE INVENTION

It is accordingly an object of the invention to provide a testing device, a transporting system, and a method for establishing the position of a notch or a bump on a disk, which overcomes disadvantages of the prior art apparatus and methods of this general type.

In particular, it is an object of the invention to provide a testing device for checking the alignment, as indicated by notches or bumps, of disk-shaped workpieces, such as wafers for example. The disk-shaped workpieces will be referred to as disks.

An important requirement for the testing device is that it must not interrupt the transport flow of the disks and consequently must perform the test quickly and without contact. The invention is therefore based on the principle of being able to determine the presence of disks, or notches or bumps on a disk edge, by using reflected light. The testing device can be used for any desired types of disks, so is not restricted to wafers.

With the foregoing and other objects in view there is provided, in accordance with the invention, a testing device for establishing a position of a notch or bump on an edge of a disk. The testing device includes: a testing area for positioning the disk to be tested thereon; a light source configured for illuminating the edge of the disk; a first light sensor configured for receiving light of the light source reflected by the edge of the disk; a second light sensor configured for receiving light of the light source reflected by the notch or the bump of the disk if the notch or the bump is located within a predetermined positional area; and an assessment unit for establishing whether the disk is positioned in the testing area based on light falling onto the first light sensor. The assessment unit is for establishing whether the notch or the bump of the disk is located within the predetermined position based on light falling onto the second light sensor.

In accordance with an added feature of the invention, the testing area is part of a transporting line for transporting the disk.

In accordance with an additional feature of the invention, a signaling device signals placement of the notch or the bump determined by testing the disk.

In accordance with another feature of the invention, a control unit is provided for controlling a transport flow of the disk dependent on a position of the notch or the bump determined by testing the disk.

In accordance with a further feature of the invention, there is provided, an alignment unit for aligning the notch or the bump of the disk dependent on a position of the notch or the bump determined by testing the disk; and a control unit for controlling the alignment unit.

In accordance with a further added feature of the invention, there is provided, a common housing. The light source and a light sensor, which is either the first light sensor or the second light sensor is unified in the common housing. The common housing is configured such that an axis of a light beam radiated from the light source impinges perpendicularly onto the edge of the disk or perpendicularly onto at least part of the notch or the bump and can be received by the light sensor in the common housing.

In accordance with a further additional feature of the invention, there is provided, an assessment unit for determining whether notches or bumps of a group of disks that are being transported together and that are being successively tested lie within the predetermined positional area.

In accordance with yet an added feature of the invention, there is provided, a common transporting device for transporting the group of disks.

In accordance with yet an additional feature of the invention, the disk is a wafer for semiconductor production.

With the foregoing and other objects in view there is also provided, in accordance with the invention, a method for establishing a position of a notch or a bump on a disk. The method includes steps of: illuminating a testing area with a light source configured for illuminating the edge of the disk; measuring light reflected by the edge if the disk is located in the testing area; measuring light reflected by the notch or the bump if the notch or the bump of the disk is located within a predetermined position; and based on the step of measuring light, establishing whether the disk is located in the testing area and establishing whether the notch or the bump of the disk is located within the predetermined position.

In accordance with an added feature of the invention, the method includes a step of establishing whether a group of disks are present in the testing area, and establishing positions for the disks of the group.

In accordance with an additional feature of the invention, the method includes a step of activating an alignment unit for aligning the notch or the bump of the disk dependent upon a position of the notch or the bump determined by testing the disk.

In accordance with another feature of the invention, the method includes a step of activating a transport control for influencing a path of the disk, dependent upon a position of the notch or the bump determined by testing the disk.

In accordance with a further feature of the invention, the method includes a step of activating a transport control for influencing a path of a group of disks, dependent upon a variable calculated from positions of notches or bumps of the group of disks.

With the foregoing and other objects in view there is provided, in accordance with the invention, a transporting system for transporting disks. The transporting system includes a testing device for establishing a position of a notch or bump on a disk. The testing device includes: a testing area for positioning thereon at least one disk to be tested, the disk having an edge with a notch or a bump; a light source configured for illuminating the edge of the disk; a first light sensor configured for receiving light of the light source reflected by the edge of the disk; a second light sensor configured for receiving light of the light source reflected by the notch or the bump of the disk if the notch or the bump is located within a predetermined positional area; and an assessment unit for establishing whether the disk is positioned in the testing area based on light falling onto the first light sensor. The assessment unit is also for establishing whether the notch or the bump of the disk is located within the predetermined position based on light falling onto the second light sensor. The testing device is integrated into a transporting path of the disk such that the disk can be tested during transport.

The testing area is in this case a predetermined spatial area, for example, a portion of a transporting device for wafers, in which the test takes place. A notch is understood as meaning a depression within the edge of the disk. The surface of the edge is consequently closer to the center of the disk in the region of the notch than on the rest of the edge. The opposite is true in the case of the projecting bump, which is further away from the center of the disk than the rest of the edge. The light sensors used may be light-sensitive semiconductor elements, such as are used, for example, in conventional light barriers. The light source may be any desired light source suitable for the desired purpose. Consequently, normal light sources such as lamps are suitable, but so are lasers, provided that they are capable, for example by using two laser beams, of illuminating regions of the edge which make it possible for both light sensors to be illuminated. Infrared lamps could be used, if for example, it is intended to work in a bright environment in which normal photocells would be affected very adversely by ambient light. For the purposes of the present invention, an edge is understood as meaning the border of the disk, that is to say the joining area between the two main surfaces, which in the case of disks are arranged approximately parallel to each other.

The predetermined positional area is that area in which the notch or bump is primarily intended to stop for the desired purpose. This may be a closely confined area if the positioning of the disk, that is to say its rotational alignment, is to be maintained very exactly; it may, however, be a larger area, if only an approximate alignment of the disk is necessary.

The assessment unit of the testing device may, in a simple case, be a simple logic circuit, which generates an output signal when it receives two signals from the light sensors. It may, however, also be a more complex device, for example, a microcontroller or some other computer. A person skilled in the art will now be familiar with the form that suitable assessment units may take.

It is preferred for the testing area to be part of a transporting line for transporting the disks. This preferred embodiment is most suitable for establishing the correct alignment of the disk quickly and without contact.

Furthermore, in the testing device there may be a signaling device for signaling the placement of the notch or bump on a tested disk. This signaling device may generate an acoustic, optical or some other signal for an operator, who then, if need be, takes the appropriate measures. There may, however, also be a device for generating a signal which is used by a further device for an adequate response to the result of the test.

The testing device may also have a control unit which controls a transport flow of the tested disk in dependence on the position of the notch or bump. Here, the control unit may, for example, respond to a transporting diverter, which directs disks that are correctly aligned onto a first track and disks with incorrect alignment onto a second track.

Furthermore, the testing device may have integrated in it or added to it a control unit which controls an alignment unit for aligning the notch or bump of the tested disk in dependence on the established position of the notch or bump. The alignment unit can be integrated either directly in the transporting path or else into the testing area, but can also, for example, be installed away from the latter in a special track of the transporting path. The alignment unit includes a mechanism that is capable of rotating the disk about its disk axis and consequently of changing its alignment. The alignment unit receives control signals from the testing device, which provides the information that a specific disk is not correctly aligned.

In a preferred embodiment of the present invention, the light source and one of the light sensors are unified in a common housing. The housing is arranged in such a way that an axis of a light beam radiated from the light source impinges perpendicularly onto the edge of the disk or perpendicularly onto at least part of the notch or bump and can be received by the light sensor in the common housing. In the case of this preferred embodiment, it is consequently possible to manage with only two housings for the three devices. Since the light beam has to be radiated back substantially onto its path of incident rays in order to arrive at the same point, that is to say the same housing, the irradiation must take place perpendicularly. For the purposes of the present invention, perpendicular is to be understood as meaning that the beam may deviate from perpendicular incidence onto one of the target surfaces at most by an amount which still allows sufficient reflected light to reach the light sensor arranged in the common housing. As described, it is optionally possible for each of the two light sensors to be accommodated in this common housing. Accordingly, if the first light sensor is accommodated in the common housing, the light source must radiate substantially perpendicularly onto the normal area of the disk, whereas, if the second light sensor is accommodated in the common housing, the light source must substantially irradiate the notch.

So far, the invention has been described with regard to the testing of a single disk. However, it is equally possible to expand the invention to testing groups of disks. A group of disks is to be understood as meaning a number of disks which must be treated together in some way or other, whether they are located in a common transporting container or they belong to a common batch or the like. In this case, the invention may either be expanded in such a way that, by providing a corresponding number of light sensors and possibly light sources, all of the disks of a group can be tested simultaneously. It is possible to provide a dedicated assessment unit to simultaneously test each disk or a common assessment unit for all of the disks, or an individual assessment unit can successively test all of the disks of a group. For example, the assessment unit can determine a proportion of disks from a group of disks to be successively tested, on which the notches or bumps lie within a predetermined positional area and in the case of which, the disks of the group can be transported together. In the case of this preferred embodiment of the invention, the assessment unit must be capable of determining, from the incoming information on the individual disks, the overall proportion of disks on which the notches or bumps lie within the predetermined positional area.

The ability of the group of disks to be transported together can be ensured by locating the disks in a common transporting device. This may be, for example, a holder with a number of holding positions for the disks. This is advanced on a transporting belt or system of transporting rails or autonomously by rollers, etc. The invention may be applied to any desired disk-shaped workpieces as long as they have an edge surface that is suitable for reflecting the incident light. The disks may be circular, oval, square or polygonal, with the testing device possibly having to be specially adapted in dependence on the form.

The invention may be applied to different technical fields. A particularly preferred embodiment is that the disks to be tested are wafers for semiconductor production, that is thin circular disks.

The invention is also directed towards a method for establishing the position of a notch or bump on disks having an edge with a notch or bump. The method has the following steps:

illuminating a testing area with a light source which is arranged in such a way that it can illuminate the edge of the disk;
  measuring light which is reflected by the edge if a disk is located in the testing area;
  measuring light which is reflected by the notch or bump if the notch or bump of a disk is located within a predetermined position; and
  establishing on the basis of the measured light whether a disk is located in the testing area and whether the notch or bump of the disk is located within the predetermined position.

The steps performed here do not necessarily have to be carried out successively, but instead, by their nature, take place simultaneously, since a measured value is available to the sensors almost immediately at the beginning of the illumination, and this measured value can be evaluated immediately.

The method can not only be used for a single disk, but can likewise be carried out for establishing the presence and position for disks of a group of disks. In this case, the steps outlined above can either be run through anew for each disk, or all the disks are simultaneously subjected to the method using a correspondingly designed device.

The method may have the further step of activating an alignment unit, in order to bring about alignment of the notch or bump of the tested disk in dependence on the established position of the notch or bump.

The measurement result of the method is consequently used in a further method step to perform a corrective action on the alignment of the disk or else the group of disks.

Moreover, the method may have the further step of activating a transport control, in order to influence the path of the tested disk or a group of disks in dependence on the established position of the notch or bump or a calculated variable from the positions of the notches or bumps of the group of disks.

Groups of disks are treated together, in particular, whenever they are located in a common transporting device, so that they can in any case only be transported together. The calculated variable may be, for example, a proportion of disks of the overall group on which the notch or bump is not located within the predetermined positional area. In this way, it can be freely decided whether individual incorrectly aligned disks are nevertheless accepted for the further process sequence, and consequently their alignment is not carried out, or whether all the disks must be aligned directly.

Finally, the invention is directed towards a transporting system for disk-shaped workpieces, which is characterized in that the inventive testing device is integrated into the transporting path of the workpieces in such a way that workpieces can be tested during transport.

Other features which are considered as characteristic for the invention are set forth in the appended claims.

Although the invention is illustrated and described herein as embodied in a testing device and method for establishing the position of a notch or bump on disks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
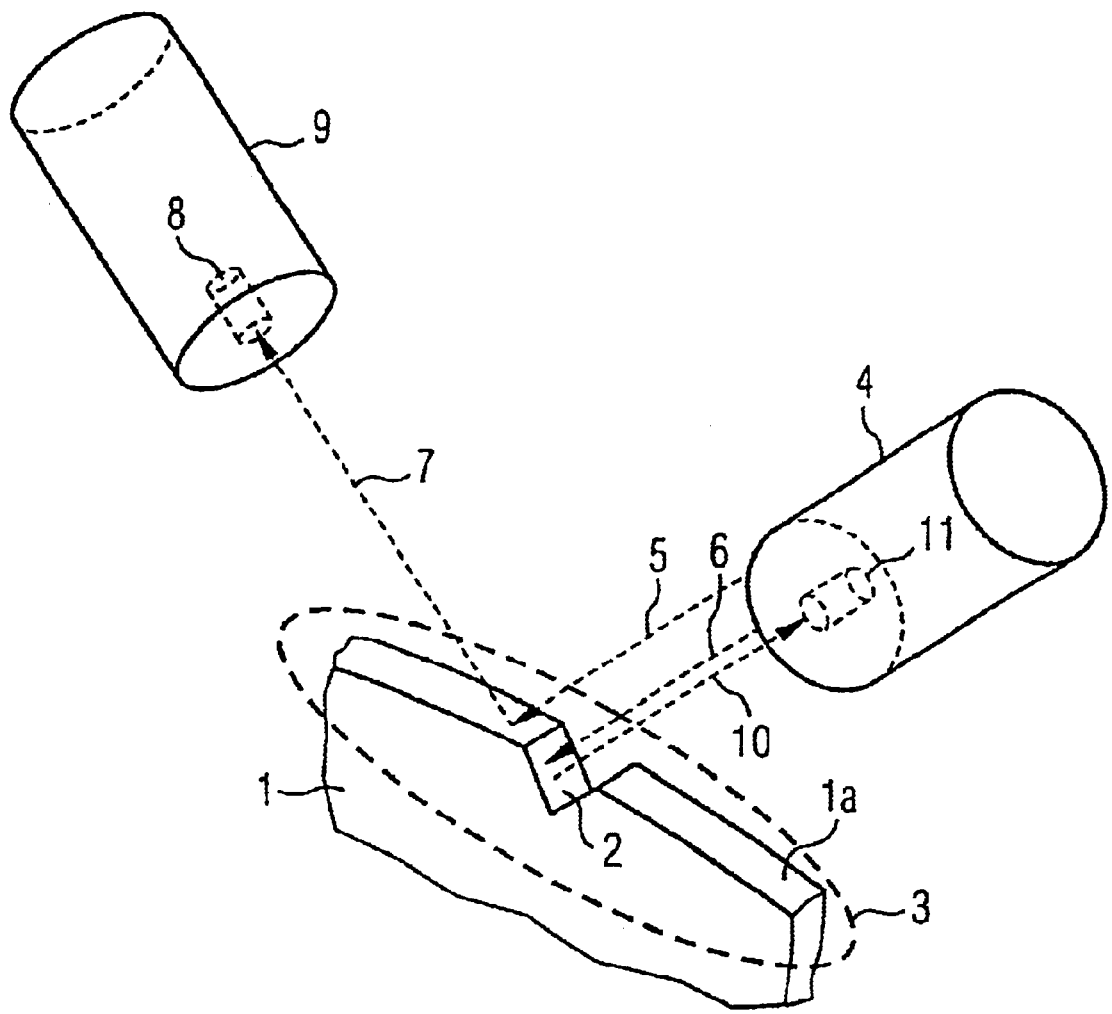
FIG. 1 is a three-dimensional view of an embodiment of the present invention.

Referring now to the figures of the drawing in detail and first, particularly, to FIG. 1 thereof, there is shown a light source and sensors of a testing device in relation to a disk 1 to be tested. The disk 1 contains a notch 2, which is also specifically referred to as such in semiconductor technology. This may optionally have two substantially planar walls, which butt against each other and are joined to each other at an acute angle, or may comprise a curved surface, for example a semicircular indentation. The notch 2 is intended, to be located within a predetermined positional area 3 (dashed line), for example, for subsequent machining steps requiring a correct alignment of the disk. A light source 4, represented by a cylinder, radiates a cone of light onto the edge 1*a*, to which the notch 2 also belongs. Only the rays of light 5 and 6 of the cone of light are represented by way of example. The incident ray of light 5 is reflected at the edge 1*a*, so that a reflected ray of light 7 impinges on the first light sensor 8, which is accommodated in a housing 9 of a type that is similar in construction to the housing of the light source. The ray of light 6 is reflected in the region of the notch, which, on account of its different spatial angle in relation to the light source, reflects the ray of light in a completely different direction than the ray of light 5, which is reflected by the edge 1a. The incident ray of light 6 is irradiated as a reflected ray of light 10 into the second light sensor 11, which is located in the same housing as the light source 4. In the specific embodiment, a concentrated light source illuminates the disk at an angle of 45 degrees. If a notch is located in the area of coverage, light is reflected on the one hand by the edge of the wafer and on the other hand by the left side face of the notch. The two light receivers, offset by 90 degrees in relation to each other, evaluate the reflected light.

Due to the reflection angles deviating by approximately 90 degrees, dependent on whether a ray of light impinges on the edge or on the notch, it is reliably possible to distinguish between those rays of light which impinge on the edge and those which impinge on the notch. If no disk 1 is located in the area of detection 3, no light is reflected, so that the evaluation unit comes to the conclusion that no disk is present.

FIGS. 2A–2D show variations of the principle on which the invention is based, with different arrangements of the light source and light sensors with respect to the disk. In FIGS. 2A–2D, the light source is represented as a small circle and the light sensors are represented as rectangles.

FIG. 2A illustrates once again the embodiment shown in FIG. 1, although in a side view and not in a perspective representation. Here, the light source 4 is separate from the second light sensor 11.

Figure 2A:
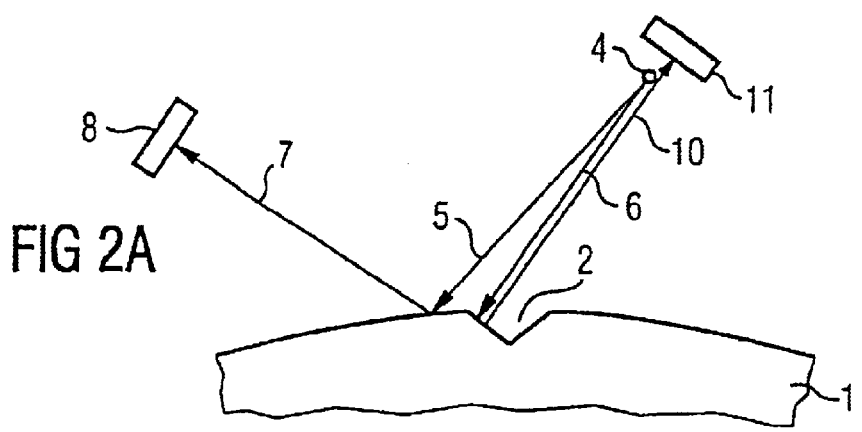
FIGS. 2A–2D show various configurations of the light source and the light sensors for realizing the invention.
Figure 2B:
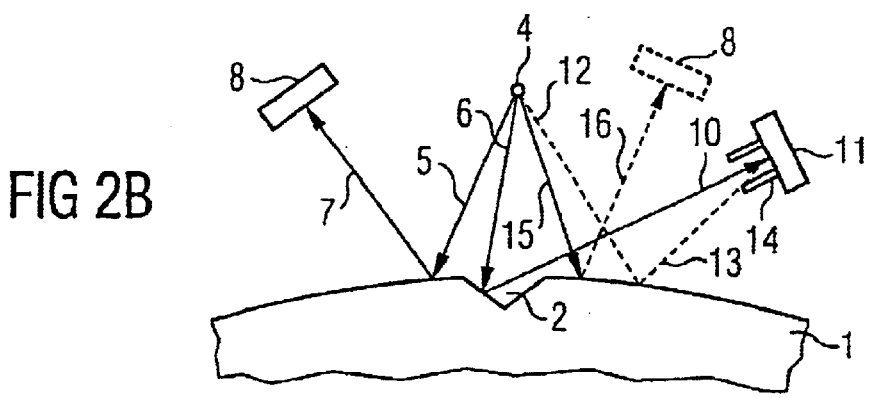

FIG. 2B shows a further embodiment of the present invention, in which the light sensors are positioned on both sides of the light source 4, which is arranged substantially directly above the notch. While the ray of light 5 in turn reaches the first light sensor 8, as reflected ray of light 7, incident ray of light 6 is reflected in the notch 2 and falls as reflected ray of light 10 onto the second light sensor 11. In the case of this arrangement, it must be taken into account that light which falls on the other side of the notch, but onto the edge, for example, ray of light 12, can likewise reach the light sensor 11 as unwanted ray 13. In order not to falsify the measurement here, it is necessary to fit a screen 14 on the second light sensor 11. The screen 14 provides a shield against such unwanted rays. In this way it is ensured that only light reflected by the notch can enter the second light sensor 11. It goes without saying that the first light sensor 8 may also be accommodated on the same side as the second light sensor 11, as represented by the first light sensor 8 which is shown by dashed lines and can be fed by light comprising reflection ray 16 resulting from incoming ray 15.

Figure 2C:
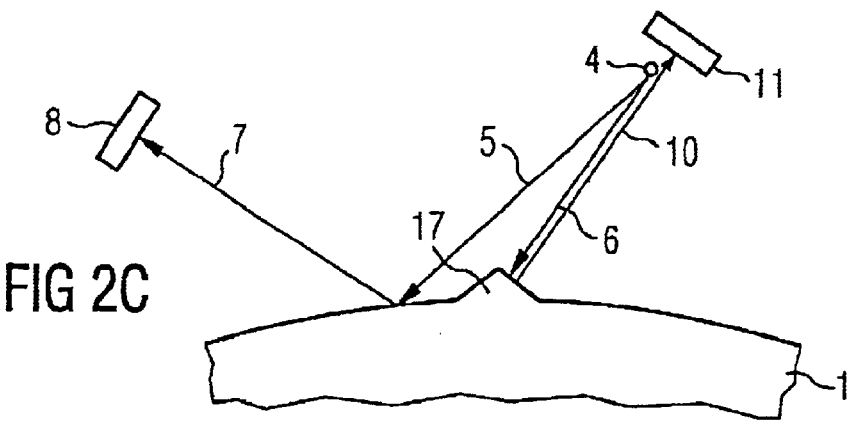

FIG. 2C shows an arrangement when a bump 17 is used instead of a notch 2, which otherwise corresponds substantially to the embodiment of FIG. 2A.

Figure 2D:
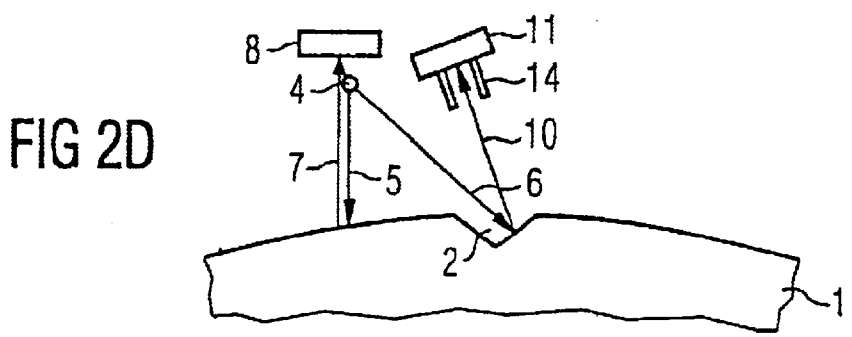

Finally, FIG. 2D shows an embodiment of the testing device in which the path of rays of the light source 4 is coupled with the path of rays of the reflected ray of light 7, which leads to the first light sensor 8. This constitutes a reversal of the principle of FIG. 2A with respect to the unification of the light source and a light sensor in one housing. In this case, the second light sensor 11, which is isolated from the light source, is consequently the one that receives the ray of light 10 reflected by the notch 2. A light screen 14 is also provided in this case. The use of such a light screen 14 depends in each case on the specific positioning of the light sensors and their specific configuration and may in principle be necessary in the case of a wide variety of configurations of the light source and light sensors.

Altogether, a testing device for disks enables the following features: detecting the presence of a disk, for example a wafer, during its transport; detecting the alignment of the disk, for example, a wafer, during transport; a high reliability of detection, irrespective of the position of the disk in a transporting device; and a high reliability of detection even under unfavorable transporting conditions, such as for example, shaking, rattling and irregular movements.

I claim:

1. A testing device for establishing a position of a notch or a bump on an edge of a disk, comprising:
   a testing area for positioning the disk thereon;
   a light source configured for illuminating the edge of the disk;
   a first light sensor configured for receiving light of said light source reflected by the edge of the disk;
   a second light sensor configured for receiving light of said light source reflected by the notch or the bump of the disk if the notch or the bump is located within a predetermined positional area; and
   an assessment unit for establishing whether the disk is positioned in said testing area based on light falling onto said first light sensor;
   said assessment unit for establishing whether the notch or the bump of the disk is located within the predetermined position based on light falling onto said second light sensor.

2. The testing device according to claim 1, wherein said testing area is part of a transporting line for transporting the disk.

3. The testing device according to claim 1, further comprising a signaling device for signaling placement of the notch or the bump determined by testing the disk.

4. The testing device according to claim 1, further comprising a control unit for controlling a transport flow of the disk dependent on a position of the notch or the bump determined by testing the disk.

5. The testing device according to claim 1, further comprising:
   an alignment unit for aligning the notch or the bump of the disk dependent on a position of the notch or the bump determined by testing the disk; and
   a control unit for controlling said alignment unit.

6. The testing device according to claim 1, further comprising:
   a common housing;
   said light source and a light sensor selected from a group consisting of said first light sensor and said second light sensor being unified in said common housing; and
   said common housing configured such that an axis of a light beam radiated from said light source impinges perpendicularly onto the edge of the disk or perpendicularly onto at least part of the notch or the bump and can be received by said light sensor in said common housing.

7. The testing device according to claim 1, further comprising an assessment unit for determining whether notches or bumps of a group of disks being transported together and being successively tested lie within the predetermined positional area.

8. The testing device according to claim 7, further comprising a common transporting device for transporting the group of disks.

9. The testing device according to claim 1, in combination with the disk, wherein the disk is a wafer for semiconductor production.

10. A method for establishing a position of a notch or a bump on a disk, the method which comprises:

illuminating a testing area with a light source configured for illuminating the edge of the disk;

measuring light reflected by the edge if the disk is located in the testing area;

measuring light reflected by the notch or the bump if the notch or the bump of the disk is located within a predetermined position; and based on the step of measuring light, establishing whether the disk is located in the testing area and establishing whether the notch or the bump of the disk is located within the predetermined position.

11. The method according to claim 10, which further comprises establishing whether a group of disks are present and establishing positions for the disks of the group.

12. The method according to claim 10, which further comprises activating an alignment unit for aligning the notch or the bump of the disk dependent upon a position of the notch or the bump determined by testing the disk.

13. The method according to claim 10, which further comprises activating a transport control for influencing a path of the disk, dependent upon a position of the notch or the bump determined by testing the disk.

14. The method according to claim 10, which further comprises: activating a transport control for influencing a path of a group of disks, dependent upon a variable calculated from positions of notches or bumps of the group of disks.

15. A transporting system for transporting disks, the transporting system including a testing device for establishing a position of a notch or a bump on an edge of a disk, the testing device comprising:

a testing area for positioning the disk thereon;

a light source configured for illuminating the edge of the disk;

a first light sensor configured for receiving light of said light source reflected by the edge of the disk;

a second light sensor configured for receiving light of said light source reflected by the notch or the bump of the disk if the notch or the bump is located within a predetermined positional area; and an assessment unit for establishing whether the disk is positioned in said testing area based on light falling onto said first light sensor;

said assessment unit for establishing whether the notch or the bump of the disk is located within the predetermined position based on light falling onto said second light sensor;

said testing device being integrated into a transporting path of the disk such that the disk can be tested during transport.

* * * * *